(12) United States Patent
Slobodin et al.

(10) Patent No.: US 9,851,854 B2
(45) Date of Patent: Dec. 26, 2017

(54) TOUCH DISPLAY DEVICE

(71) Applicant: Microsoft Technology Licensing, LLC, Redmond, WA (US)

(72) Inventors: David Elliott Slobodin, Lake Oswego, OR (US); Jonathan Westhues, Portland, OR (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 199 days.

(21) Appl. No.: 14/727,759

(22) Filed: Jun. 1, 2015

(65) Prior Publication Data
US 2016/0170522 A1    Jun. 16, 2016

Related U.S. Application Data

(60) Provisional application No. 62/092,566, filed on Dec. 16, 2014.

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *G06F 3/0416* (2013.01);
(Continued)

(58) Field of Classification Search
CPC ...... G06F 3/0412; G06F 3/0416; G06F 3/044; G09G 2320/0626; G09G 3/3291; H01L 27/323
(Continued)

(56) References Cited

U.S. PATENT DOCUMENTS 7,116,058 B2    10/2006    Lo et al.
7,812,827 B2    10/2010    Hotelling et al.
(Continued)

FOREIGN PATENT DOCUMENTS

CN    102455812 A    5/2012

OTHER PUBLICATIONS

ISA European Patent Office, International Search Report and Written Opinion issued in Application No. PCT/US2015/064165, dated Mar. 23, 2016, WIPO, 13 pages.
(Continued)

*Primary Examiner* — Tony Davis
(74) *Attorney, Agent, or Firm* — Alleman Hall Creasman & Tuttle LLP

(57) ABSTRACT

A touch display device includes a display panel, a plurality of receive electrodes, an enable electrode driver, and a touch sense circuit. The display panel includes a plurality of data electrodes and a plurality of enable electrodes connected to a plurality of display cells. Each display cell is connected to a pair of an enable electrode and a data electrode. The enable electrode driver drives a first enable electrode with a display voltage to activate display cells coupled to the first enable electrode, and drives a second enable electrode different than the first enable electrode with a transmit voltage to produce a capacitive coupling between the second enable electrode and a receive electrode. The touch sense circuit is configured to recognize a touch input to the touch display device based on a change in capacitance between the second enable electrode and the receive electrode.

19 Claims, 6 Drawing Sheets

(51) Int. Cl.
*G09G 3/3291* (2016.01)
*H01L 27/32* (2006.01)

(52) U.S. Cl.
CPC ... *G09G 3/3291* (2013.01); *G09G 2320/0626* (2013.01); *H01L 27/323* (2013.01)

(58) Field of Classification Search
USPC .................................................. 345/170–176
See application file for complete search history.

(56) References Cited

U.S. PATENT DOCUMENTS

| | | | |
|---|---|---|---|
| 7,868,880 B2 | 1/2011 | Ozaki et al. | |
| 8,174,467 B2* | 5/2012 | Kaneko | G09G 3/3233 315/169.3 |
| 8,686,925 B2 | 4/2014 | Chung et al. | |
| 8,760,412 B2 | 6/2014 | Hotelling et al. | |
| 2004/0217945 A1* | 11/2004 | Miyamoto | G06F 3/0412 345/173 |
| 2008/0062140 A1* | 3/2008 | Hotelling | G09G 3/3648 345/173 |
| 2008/0284691 A1* | 11/2008 | Chung | G09G 3/3291 345/76 |
| 2010/0194697 A1* | 8/2010 | Hotelling | G06F 3/0412 345/173 |
| 2010/0253638 A1 | 10/2010 | Yousefpor et al. | |
| 2011/0187677 A1* | 8/2011 | Hotelling | G06F 3/0412 345/174 |
| 2012/0086656 A1* | 4/2012 | Hung | G06F 3/0416 345/173 |
| 2013/0050130 A1* | 2/2013 | Brown | G06F 3/044 345/174 |
| 2013/0194231 A1* | 8/2013 | Smith | G06F 3/044 345/174 |
| 2013/0293513 A1* | 11/2013 | Hotelling | G02F 1/13338 345/174 |
| 2013/0307791 A1* | 11/2013 | Edwards | G06F 3/0416 345/173 |
| 2013/0342478 A1 | 12/2013 | Bae et al. | |
| 2013/0342479 A1 | 12/2013 | Pyo et al. | |
| 2014/0204067 A1 | 7/2014 | Gupta | |
| 2014/0225840 A1 | 8/2014 | Jamshidi-Roudbari et al. | |
| 2014/0313164 A1 | 10/2014 | Pi | |
| 2015/0077375 A1* | 3/2015 | Hotelling | G06F 1/3218 345/173 |
| 2015/0097808 A1* | 4/2015 | Roh | G06F 3/0412 345/174 |
| 2015/0177869 A1 | 6/2015 | Morein et al. | |
| 2015/0185935 A1* | 7/2015 | Jang | G06F 3/0416 345/174 |
| 2015/0205428 A1* | 7/2015 | Wang | G06F 3/044 345/174 |

OTHER PUBLICATIONS

Chang, et al., "Global Display", In Asia Pacific Equity Research, J.P. Morgan, May 21, 2014, 21 pages.

Jeong, et al., "A New Era of Oxide Thin-Film Transistors for Large-Sized AMOLED Displays", Published on: Dec. 12, 2014, Available at; https://www.ualberta.ca/~chung3/papers/2008_ID.pdf.

Han, et al., "a-Si:H TFT and Pixel Structure for AMOLED on a Flexible Metal Substrate", Published on: Dec. 12, 2014, Available at: http://cdn.intechopen.com/pdfs-wm/11533.pdf.

IPEA European Patent Office, International Preliminary Report on Patentability Issued in PCT Application No. PCT/US2015/064165, dated Oct. 28, 2016, WIPO, 7 pages.

* cited by examiner

TOUCH DISPLAY DEVICE

CROSS-REFERENCE TO RELATED APPLICATIONS

This application claims priority to U.S. Provisional Patent Application Ser. No. 62/092,566, entitled "OLED IN-CELL TOUCH DISPLAY," filed Dec. 16, 2014, the disclosure of which is hereby incorporated by reference in its entirety and for all purposes.

BACKGROUND

Touch displays may be found in computing devices ranging from small, handheld devices to large-format, multi-user devices. Various technologies may be combined to provide suitable display and touch input functionality in a computing device. In one example, transmit and receive electrodes of a capacitive touch sensor are overlaid as discrete layers on a display panel of a computing device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A touch display device includes a display panel, a plurality of receive electrodes, an enable electrode driver, and a touch sense circuit. The display panel includes a plurality of data electrodes and a plurality of enable electrodes connected to a plurality of display cells. Each display cell is connected to a pair of an enable electrode and a data electrode. The enable electrode driver drives a first enable electrode with a display voltage to activate display cells coupled to the first enable electrode, and drives a second enable electrode different than the first enable electrode with a transmit voltage that does not activate the display cells coupled to the second enable electrode and produces a capacitive coupling between the second enable electrode and one or more of the plurality of receive electrodes. The touch sense circuit is configured to recognize a touch input to the touch display device based on a change in capacitance between the second enable electrode and one or more of the plurality of receive electrodes.

DETAILED DESCRIPTION

The present disclosure relates to an approach for controlling a touch display device having an active matrix display panel that includes a plurality of enable electrodes. The present disclosure also relates to a drive scheme for the plurality of enable electrodes in which one or more selected enable electrodes are driven with a display voltage that cause the active matrix display panel to display an image. Further, while the one or more selected enable electrodes are being driven with the display voltage, other selected enable electrodes may be driven with a transmit voltage that differs from the display voltage. In particular, the transmit voltage does not activate the display cells connected to the other selected enable electrodes (i.e., the enable electrodes being driven with the transmit voltage). Further, the transmit voltage may be configured to produce a capacitive coupling with receive electrodes coupled to the active matrix display panel. The resulting capacitance/charge (and changes thereto) may be used to recognize touch input to the touch display device. In some implementations, the transmit voltage may have a polarity that opposes a polarity of the display voltage in order to easily differentiate a capacitance resulting from the capacitive coupling relative to a capacitance generated from activation of the display cells to produce an image.

By utilizing the image-producing enable electrodes already present in the active matrix display panel also as transmitting electrodes of a touch sensor, a discrete transmit electrode layer that would otherwise be used to enable touch sensing may be eliminated from the touch display device. Also, a corresponding adhesive layer that would attach the discrete transmit electrode layer to the active matrix display panel may be eliminated from the touch sensing display device. Accordingly, a touch display device configured in such a manner may have reduced production costs, reduced complexity, and reduced device thickness relative to a touch display device having discrete layers of display enable electrodes and touch transmit electrodes. Moreover, such an approach may be beneficially employed to provide touch sensing functionality to a modular active matrix display panel that is not natively designed with an in-cell touch sensor.

Figure 1:
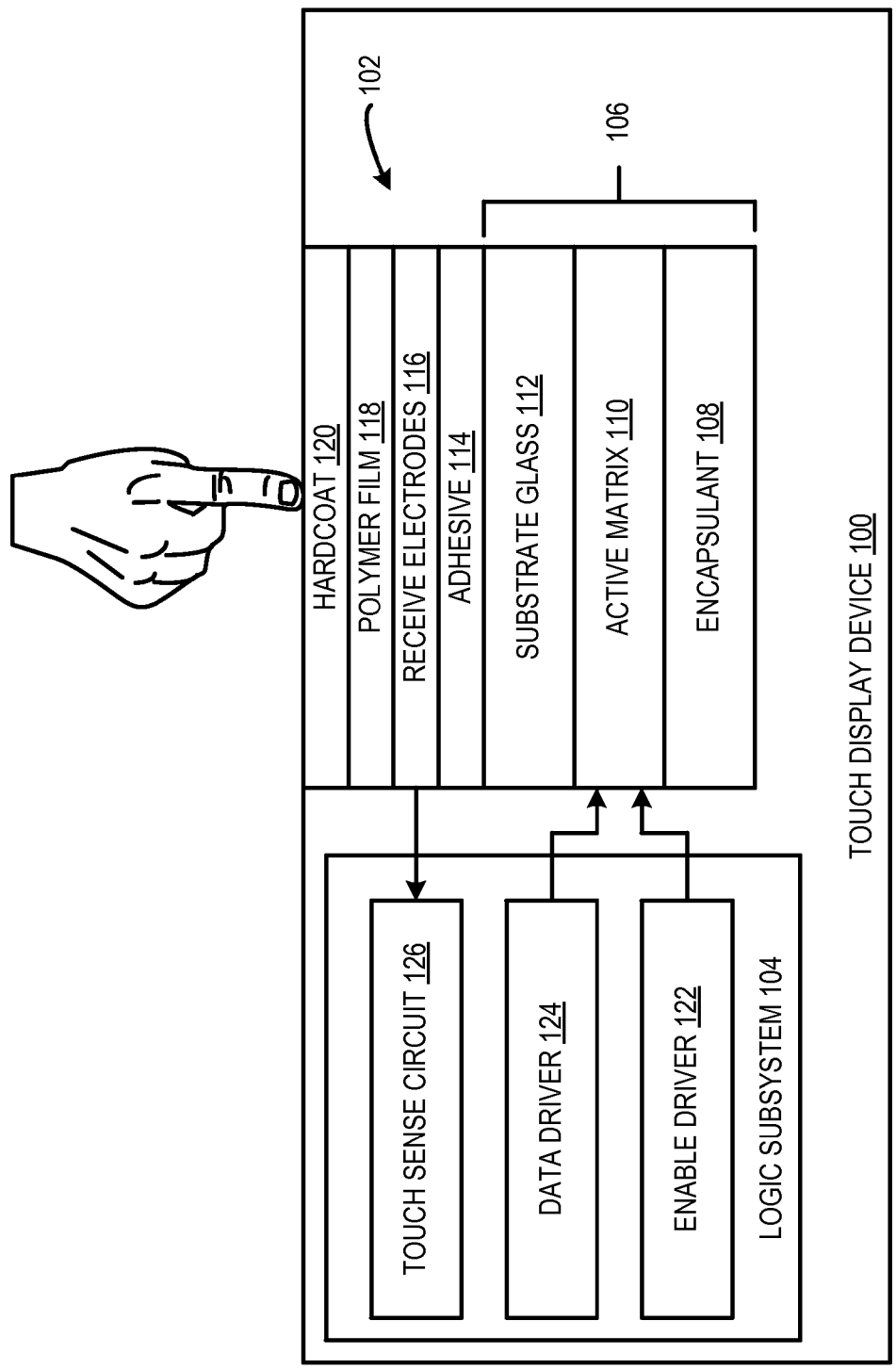
FIG. 1 shows an example touch display device.

FIG. 1 schematically shows an example touch display device 100. The touch display device 100 may include a touch display stack 102 and a logic subsystem 104. The touch display stack 102 includes an active matrix display panel 106. The active matrix display panel 106 includes a plurality of display cells arranged in an active matrix 110. The active matrix 110 of display cells may be sealed between an encapsulant 108 and a substrate glass 112. For example, the encapsulant 108 may be a cured polymeric material applied to a layer of glass or metal. Each display cell of the active matrix 110 may be individually addressed (e.g., each display cell may be connected to a different pair of an enable electrode and a data electrode) to activate a display element of the display cell to form an image displayed by the active matrix display panel 106.

In the depicted implementation, the active matrix display panel 106 may be referred to as a "bottom-emission device," because light may be emitted through the substrate glass. In other implementations, the active matrix display panel 106 may be a "top-emitting device" where light is emitted through the encapsulant 108. In such a configuration, the encapsulant 108 may include a cured polymeric applied to a layer of glass or other optically clear material.

Figure 2:
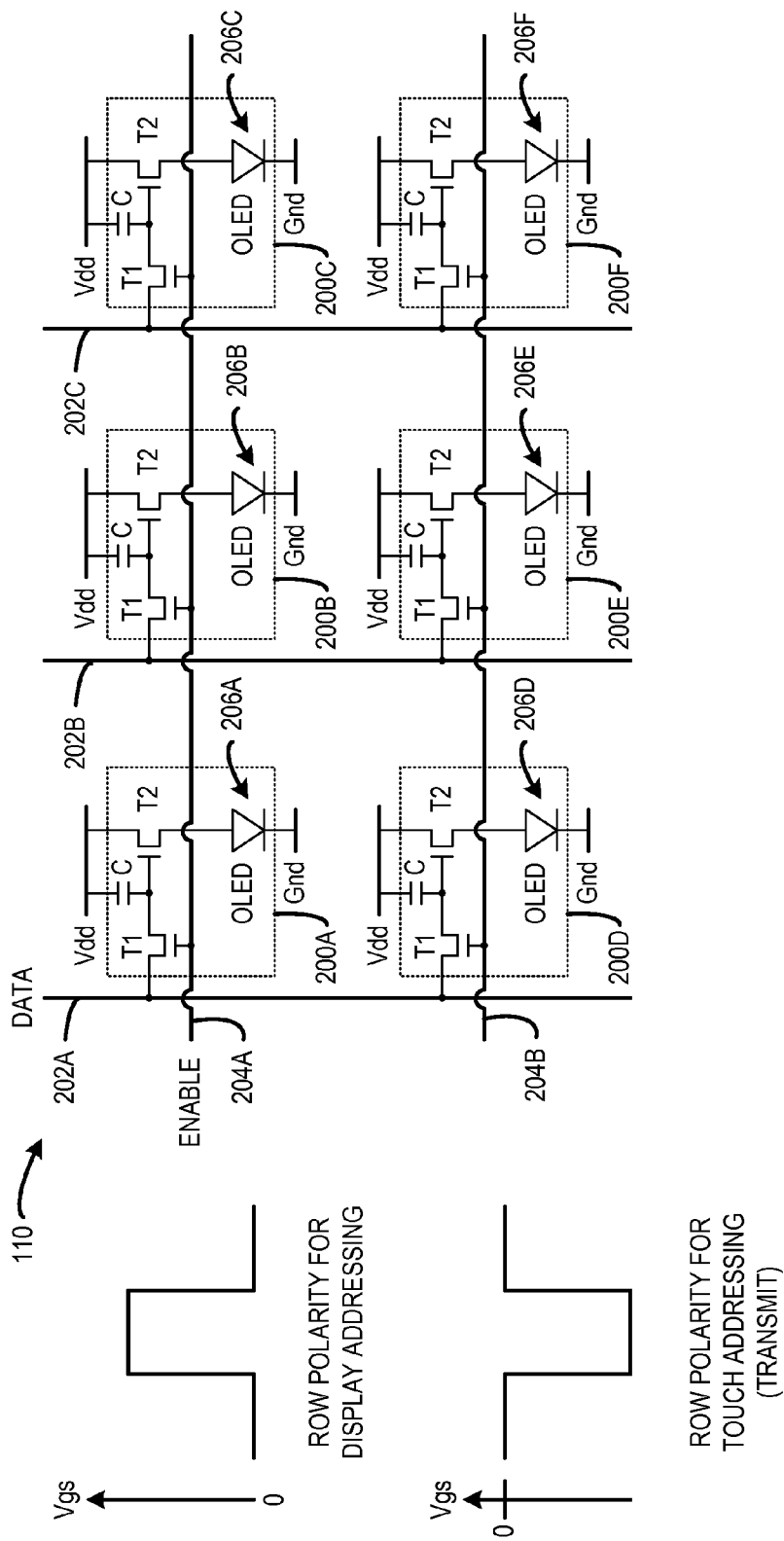
FIG. 2 shows a portion of an example display panel of the touch display device of FIG. 1.

FIG. 2 shows an example portion of the active matrix 110 of display cells of the touch display device of FIG. 1. The active matrix 110 of display cells may include a plurality of display cells 200 (e.g., 200A-200F), a plurality of data electrodes 202 (e.g., 202A, 202D, 202C) connected to the plurality of display cells 200, and a plurality of enable electrodes 204 (e.g., 204A, 204B) connected to the plurality of display cells 200. In, particular each display cell may be connected to a different pair of an enable electrode and a data electrode (e.g., display cell 200A is connected to data electrode 202A and enable electrode 204A). In the illustrated implementation, the data electrodes 202 are arranged as columns and the enable electrodes 204 are arranged as rows. In other implementations, the data electrodes may be arranged as rows and the enable electrodes may be arranged as columns. In still other implementations, the data electrodes and the enable electrodes may be arranged in a different manner, for example in a hexagonal or pentile configuration. Also, in row-column implementations, the rows and columns need not be arranged exactly perpendicular to one another, though that will often be the case.

Each display cell 200 (e.g., 206A-206F) includes a display element 206 (e.g., 206A-206F). Each display element 206 may be configured produce (or transmit light as in the case of MOEMs) light responsive to activation of a corresponding display cell 200. In the illustrated implementation, the display elements 206 include organic light emitting diodes (OLEDs). In other implementations, the display elements 206 may include light-emitting field effect transistors (LEFETs) or other unipolar display technologies. In other implementations, the display elements 206 may include electrophoretic cells (e.g., e-paper). In other implementations, the display elements 206 may include micro-opto-electro-mechanical systems (MOEMS). Any suitable light producing technology may be employed as the display elements 206 of the display cells 200.

In the illustrated implementation, each display cell 200 includes a first transistor T1, a capacitor C, and a second transistor T2 that collectively control a flow of current to activate each individual OLED 206. Note that the display cell 200 is shown in simplified form, and other circuit configurations may be employed. In one example, the first transistor T1 and the second transistor T2 are thin-film-transistors (TFTs). The first and second TFTs may be included in a TFT array on which the plurality of OLEDs may be deposited or integrated to produce an active matrix of OLEDS.

In the illustrated implementation, the first transistor T1 is arranged such that its drain is connected to the data electrode 202, its gate is connected to the enable electrode 204, and its source is connected to the gate of the second transistor T2. The capacitor C is arranged such that a first side is connected between the source of the first transistor T1 and the gate of the second transistor T2, and a second side is connected to a power supply Vdd. The second transistor T2 is arranged such that the drain is connected to the power supply Vdd, the gate is connected to the source of the first transistor T1 and the first side of the capacitor C, and the source is connected to the OLED 206. The OLED 206 is connected between the source of the transistor T2 and relative ground Gnd.

In such an arrangement, under some conditions, the enable electrode 204 may be driven with a display voltage configured to activate display cells 200 that are connected to the enable electrode 204. In particular, while an enable electrode 204 is driven with a display voltage that exceeds a gate-to-source voltage threshold (e.g., +0.3 volts for an oxide TFT) of the first transistor T1, the first transistor T1 may be turned on to activate the display cells 200 that are connected to the enable electrode 204. Note that the display voltage may be any suitable voltage greater than the gate-to-source voltage threshold. For example, the display voltage may be at least +5 volts.

In such an activation state, a display current may flow across the first transistor T1 to charge the capacitor C. Further, the display current may flow to the gate of the second transistor T2 to turn on the second transistor T2. When the second transistor T2 is turned on, the OLED 206 receives current from the power supply Vdd to update the brightness level of the OLED 206. The display current may be proportional to an individual brightness voltage driven on the data electrode 202. In one example, a duty cycle and/or pulse width at which the brightness voltage is driven on the data electrode 202 may be modified to adjust the brightness level of the OLED 206. In other examples, a constant current (i.e., not produced via duty cycle/PWM) controls the output of the OLED. Each of the data electrodes that are connected to the display cells connected to the enable electrode being driven with the display voltage are driven with the individual brightness voltages simultaneously. By driving each data electrode 202 with an individual brightness voltage (or according to an individual duty cycle/pulse width modulation), a brightness level of each OLED 206 in a display cell 200 that is connected to the enable electrode 204 that is being driven with the display voltage may be individually adjusted.

Furthermore, in such an arrangement, under some conditions, the enable electrode 204 may be driven with a transmit voltage. The transmit voltage does not activate the display cells 200 that are connected to the enable electrode 204, and, as explained in more detail below, enables touch sensing functionality. When the transmit voltage is applied to the gate of the first transistor T1, the first transistor T1 is placed in a depletion state in which no usable current flows across the first transistor T1 (i.e., no current flows to induce image-producing behavior in the OLED). In one example, the transmit voltage may be biased in a polarity that opposes a polarity of the display voltage in order to place the transistor T1 in the depletion state. For example, the display voltage may be a positive voltage and the transmit voltage may be a negative voltage.

When the enable electrode 204 is driven with the transmit voltage, and the first transistor T1 of each display cell 200 that is connected to the enable electrode 204 is placed in the depletion state, the enable electrode 204 may produce a transmit signal. The transmit signal is capacitive coupled between the enable electrode and one or more receive electrodes of a layer of receive electrodes 116 (shown in FIG. 1) that are proximate to the enable electrode 204. The capacitive coupling of the transmit signal between the enable electrode and one or more receive electrodes is influenced by objects, particularly conductive objects, coming into proximity of the electrodes. This influence on the capacitive coupling may be analyzed by the touch sense circuit 126 (shown in FIG. 1) to recognize a touch input or stylus input to the touch display device 100.

Specifically, the transmit voltage causes a charge to accumulate on the receive electrodes traversed by the enable electrode. This accumulated charge causes a discernible signal to be realized within a detect circuit coupled to each receive electrode. When a finger or stylus is brought near or into contact with or near a given grouping of receive electrodes, the finger or stylus affects the amount of charge on those receive electrodes, thereby causing a change in current and/or voltage observed at the detect circuits coupled to the receive electrodes. In an implementation in which the receive electrodes are column electrodes that extend vertically in a "Y direction," the observed change at the described detect circuits allows the system to determine the horizontal position (in the "X direction") of the touch event. The vertical position is determined based on which enable electrode(s) were drive high at the time of the recognized touch event.

In one example, the enable electrode may be driven to a relatively large negative voltage in order to produce a transmit signal across an entire enable electrode of a large-format touch display (e.g., a display measuring at least 55 inches diagonally) having a capacitance that is clearly distinguishable from other capacitances produced by capacitive coupling from other operations of the active matrix display panel 106 (e.g., driving an enable electrode with a display voltage and driving of the data electrodes). In particular, a larger negative transmit voltage provides a larger signal in response to a touch event while not increasing background noise, thereby providing a higher signal-to-noise ratio, which may enable more accurate touch input detection (e.g., large changes in capacitance from the baseline capacitance may produce less false positives). In some implementations, the transmit voltage may be modulated at a frequency and waveform that differs from a waveform of the display enable voltage. Accordingly, any coupling from the enable voltage may be filtered out.

In one example, the transmit voltage has an unsigned magnitude that is at 3-4 times a magnitude of the display voltage. For example, if the display voltage is +5 volts then the transmit voltage is at least −20 volts. In a more particular example, the transmit voltage is approximately −30 volts. Smaller differences are possible, though in some cases such smaller differences may require a more-constrained tuning of the detection circuit coupled to each receive electrode. In some implementations, the transmit voltage may be greater than a threshold voltage that is designated based on a size of the touch display. For example, a larger display may produce a level of capacitive noise that is greater than a level of capacitive noise of a smaller display. As such, a threshold to recognize touch input to the larger display may be greater than a threshold to recognize touch input to the smaller display in order to differentiate the greater level of capacitive noise. Moreover, the large negative voltage may distinguish the transmit signal from electrical noise produced from displaying an image on the large-format display. Although, in some implementations, the transmit voltage may not be higher than the display voltage. Rather, the different voltages may be identified based on different polarities, and further based on known signal timing.

In some implementations, the transmit voltage may be driven at a frequency that differs from a frequency at which the display voltage is driven. For example, enable electrodes selected to be driven with the transmit voltage may be toggled a plurality of times (e.g., 3-4×) during a period where a selected enable electrode is driven with the display voltage. The difference between the transmit signal frequency and the drive signal frequency may produce a touch input capacitance that is clearly distinguishable from a display capacitance produced the active matrix display panel 106.

Furthermore, the illustrated active matrix display panel 106 including OLEDs may be particularly suited for large-format touch display applications in which large negative transmit voltages are applied to the enable electrodes relative to other display technologies. In particular, in the depletion state, the TFT gate voltage may be limited by a dielectric strength of the gate insulator and a resistance to semi-permanent charge injection that can cause a threshold voltage shift. The illustrated display cell arrangement including the TFTs (e.g., T1, T2) and OLED may have a high dielectric strength and resistance to threshold voltage shifts. In contrast, a conventional large-format in-cell touch display that employs active matrix liquid crystal display (LCD) cells having amorphous silicon TFTs, may be susceptible to large threshold voltage shifts with large depletion voltage bias. In other words, the amorphous silicon TFTs used in such active matrix LCD panels may be unable to be driven by such a large negative transmit voltage to produce a transmit signal suitable to enable touch input functionality without the LCD suffering from negative consequences.

The active matrix 110 of display cells may include any number of display cells. For example, the active matrix display panel 106 may be an ultra-high-definition display panel. In one particular example, the active matrix display panel 106 may have at least 3840×2160 pixel resolution. In such an arrangement, the display cells 200 may correspond to different subpixels that may be grouped together to form pixels of the display panel 106. In particular, different display cells may correspond to different subpixels associated with different colors. The differently colored subpixels may be grouped together to form each pixel of the touch display device 100. Any suitable arrangement of different color subpixels may be grouped to form a pixel of the touch display device 100.

Continuing with the touch display stack 102 of FIG. 1, a layer of receive electrodes 116 may be overlaid on top of the active matrix display panel 106. In particular, the receive electrodes 116 may be patterned on a polymer film 118, and the polymer film 118 with the receive electrodes 116 may be coupled to the active matrix display panel 106 via an optically clear adhesive layer 114. The layer of receive electrodes 116 may include a plurality of receive electrodes configured to cooperate with the plurality of enable electrodes 204 (shown in FIG. 2) of the active matrix 110 of display cells as part of a touch sensor. An optically clear hardcoat 120 may be coupled to the polymer film 118 and positioned at a top of the touch display stack 102 to provide damage resistance, structural integrity, and environmental protection for internal layers of the touch display device 100.

The illustrated display stack 102 does not include a discrete transmit electrode layer (for touch sensing) located internally within the display panel 106 or externally coupled to the display panel 106. Such a discrete transmit electrode layer may be omitted, because the enable electrodes of the active matrix 110 provide image display and transmit electrode excitations for touch sensing functionality. The illustrated touch display stack 102 is an example. In some implementations, the touch display stack 102 may include additional layers. In other implementations, some layers may be differently configured or omitted from the touch display stack 102.

The logic subsystem 104 may be configured to control the touch display stack 102 to provide display and touch sensing functionality. The logic subsystem 104 may include any suitable configuration of hardware, software, firmware, or combination thereof. The logic subsystem 104 includes an enable driver 122, a data driver 124, and a touch sense circuit 126.

The enable driver 122 may be configured to drive the plurality of enable electrodes 204 of the active matrix 110 of display cells according to a drive scheme to provide display functionality and touch sensing functionality. In particular, the enable driver 122 may be configured to perform a display sequence in which the plurality of enable electrodes 204 are scanned in sequence with the display voltage. While a given enable electrode 204 is driven with the display voltage, display cells 200 connected to the enable electrode 204 may be activated to update brightness levels of light produced by a display element 206 of the display cell 200. In one particular example, the display voltage may be applied sequentially row by row from top to bottom of the active matrix 110. Such a display sequence may be repeated according to a video frame rate (e.g., 60 Hz or 120 Hz) of the touch display device 100.

Furthermore, the enable driver 122 may be configured to perform a touch input sequence in cooperation with the display sequence. In particular, the enable driver 122 may be configured to drive one or more enable electrodes 204 (e.g., a first subset of enable electrodes) that are not being driven with the display voltage, with the transmit voltage. While a given enable electrode 204 is driven with the transmit voltage, display cells 200 connected to the enable electrode 204 are not activated. Moreover, the transmit voltage may be configured to produce a capacitive coupling between the one or more enable electrodes 204 that are driven with the transmit voltage and one or more receive electrodes of the receive electrodes layer 116. Typically, a capacitive coupling is formed between an enable electrodes being driven with the transmit voltage and all receive electrodes of the receive electrode layer 116. However, there may be some receive electrode geometries where a capacitive coupling is formed between the enable electrodes being driven with the transmit voltage and less than all receive electrodes of the receive electrode layer 116.

In some implementations, a plurality of enable electrodes may be simultaneously driven with the transmit voltage to produce a transmit signal for capacitive coupling. In some such implementations, the plurality of enable electrodes may be neighboring enable electrodes in the active matrix 110. In other such implementations, the plurality of enable electrodes may include enable electrodes that neighbor an enable electrode being driven with the display voltage in the active matrix 110. Such implementations may be particularly applicable for generating a capacitive coupling having a suitable signal strength to provide touch sensing functionality for a large-format touch display device.

In one particular example, a large-format touch display device configured with 3820×2160 pixel resolution may have a pixel pitch that is approximately 0.3 mm. In other words, a spacing between enable electrodes may be 0.3 mm or less. Further, a pitch (spacing) of the receive electrodes may be 5-6 mm (e.g., sufficiently sized to interpolate finger or stylus position). Due to the size difference between the receive electrodes and the pixel pitch, multiple proximate enable electrodes may be simultaneously driven with the transmit voltage. In one particular example, a subset of 10-12 enable electrodes is driven with the transmit voltage at the same time in order to provide a transmit signal having suitable signal strength to provide touch input functionality for the above described touch display device. In particular, a size of an electric field produced by simultaneous excitation of a plurality of enable electrodes is greater than a size of an electric field produced by excitation of a single enable electrode. Any number of enable electrodes may be simultaneously driven with the transmit voltage. When multiple enable electrodes are driven with the transmit voltage, the electrodes are in a localized grouping in order to, in an arrangement where the enable electrodes extend horizontally in an "X direction," enable discernment of the vertical "Y direction" position of recognized touch events.

The display sequence and the touch input sequence are described as being performed in cooperation, because as the enable driver 122 iterates through the different enable electrodes 204 in the display sequence, the enable driver 122 also changes the enable electrodes 204 that are being driven with the transmit voltage such that no enable electrode is driven with both the display voltage and the transmit voltage at one time. As such, display cells 200 connected to all enable electrodes 204 of the active matrix 110 may receive updated brightness levels by performing the display sequence, while also continuously providing touch input functionality.

In some implementations, the enable driver 122 may be configured to hold other enable electrodes (e.g., a second subset) that are not being driven with the display voltage or the transmit voltage at a relative ground (or another differentiating voltage). By holding these enable electrodes at a relative ground, a capacitance of these enable electrodes contributes relatively less or not at all to increasing capacitance under test (e.g., the mutual capacitance between the transmitting enable electrode and a receive electrode). As such, a dynamic range of the touch sense circuit may be reduced relative to an approach where the other enable electrodes contribute to the capacitance under test. In other implementations, the second subset of enable electrodes may be left electrically floating. Typically, at any given time, the enable electrodes are in one of three states: (1) one enable electrode is driven with the display voltage to support display functionality along that row (or column); (2) one or more enable electrodes are driven with the transmit voltage in order to cause charge to accumulate on the receive electrodes, such charge being varied in a detectable manner at one or more of the receive electrodes in response to touch or hover of a stylus or finger; and (3) several enable electrodes, typically the large majority, are floating or at ground or otherwise in a state where they do not enable display cells and do not cause charge accumulation on the receive electrodes to an extent that would interfere with touch functionality.

Continuing with the logic subsystem 104, the data driver 124 may be configured to, while an enable electrode 204 is being driven with the display voltage, simultaneously drive a plurality of data electrodes 202 connected to display cells 220 that are connected to the enable electrode 204 that is being driven with the display voltage with individual brightness voltages. In particular, each data electrode may be driven with an individual brightness voltage to adjust an individual brightness level of a display element of the activated display cell.

The touch sense circuit 126 may be configured to recognize a touch input to the touch display device based on a change in capacitance between one or more enable electrodes 204 being driven with the transmit voltage and one or more receive electrodes of the receive electrodes layer 116. For example, the presence of touch input (e.g., a finger, stylus, or other touch implement) near the surface of the hardcoat 120 may affect a local fringe field created by the capacitive coupling. In particular, the touch input may reduce a mutual capacitance between an enable electrode and a receive electrode that are capacitively coupled. The touch sense circuit 126 may be configured to recognize touch input to the touch display device 100 from any suitable touch implement.

In one example, the touch sense circuit 126 may be configured to measure a change in capacitance at every individual pair of transmit and receive electrodes that are capacitively coupled to accurately determine a touch input location on the surface of the touch display device 100. For example, a capacitive coupling without the presence of a touch or hover input may produce a baseline capacitance (e.g., measured as a baseline current), and the touch sense circuit 126 may be configured to recognize a touch input based on a measured current differing from the baseline current by more than a threshold difference. For example, the threshold difference may be designated based on the magnitude of the baseline current, signal noise of the touch display device, and/or other design factors of the touch display device.

The display voltage and transmit voltage may be distinguished by one or more of the following: (1) the display voltage enables the display cells connected to the enable electrode, while the transmit voltage disables them; (2) the display voltage is in an opposing polarity to the transmit voltage; and (3) the transmit voltage induces a substantially different charge accumulation on the receive electrodes than that induced as a result of display operations, i.e., the application of the display voltage and the voltage levels carried on the data electrodes.

Figure 3:
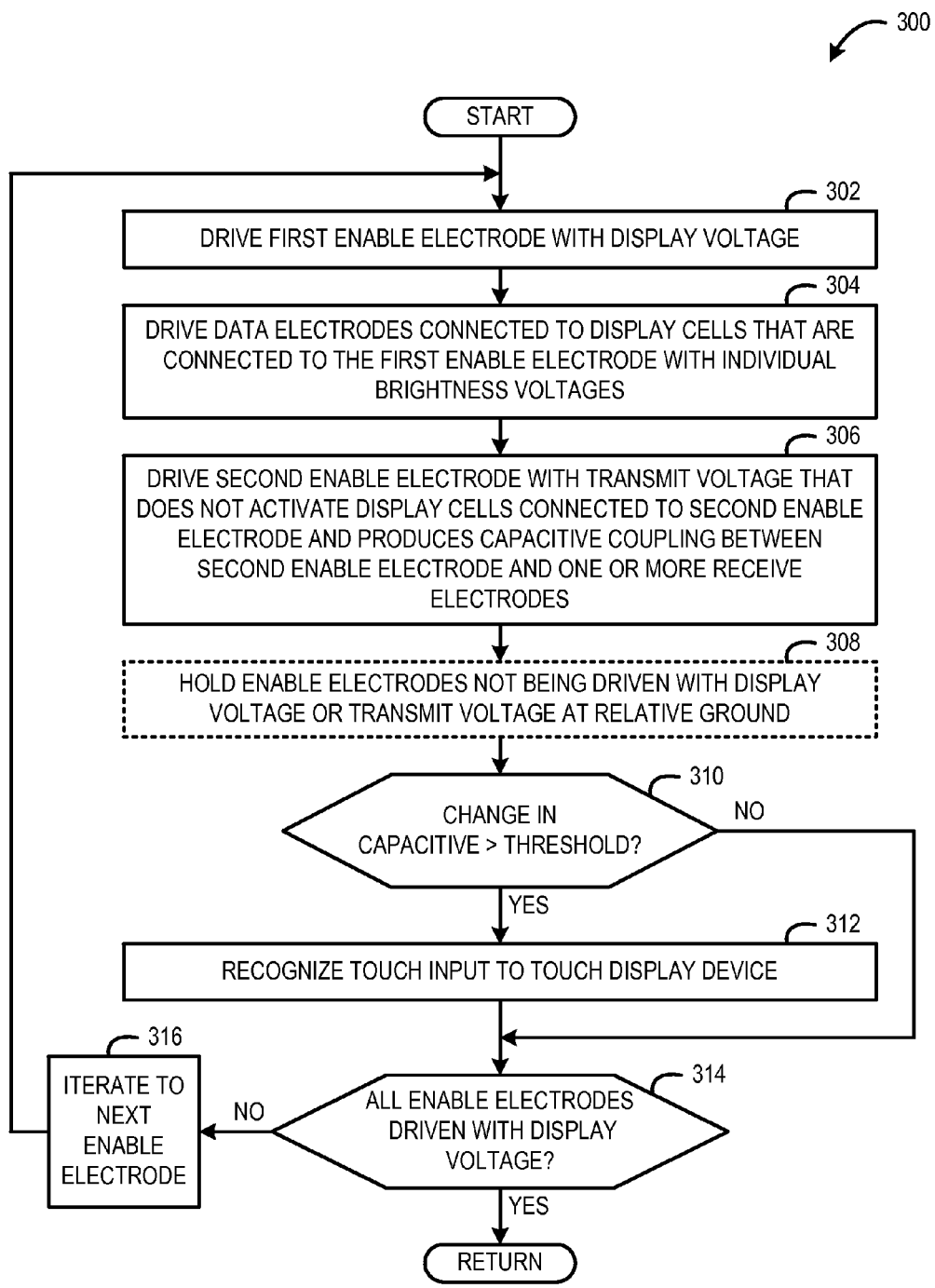
FIG. 3 shows an example method for controlling the touch display device of FIG. 1.

FIG. 3 shows an example method 300 for controlling a touch display device. In one example, the method 300 may be performed by the logic subsystem 104 to control operation of the touch display device 100 of FIG. 1. In another example, the method 300 may be performed by the computing system 700 of FIG. 7.

At 302, the method 300 includes driving a first enable electrode of an active matrix display panel with a display voltage to activate display cells connected to the first enable electrode.

At 304, the method 300 may include, while the first enable electrode is being driven with the display voltage, driving data electrodes connected to display cells that are connected to the first electrode with individual brightness voltages (or currents). Each individual brightness voltage may be configured to adjust an individual brightness level of a display element of a display cell connected to the first enable electrode and a selected data electrode. For example, the individual brightness voltage may be determined based on a position of the display cell in an image being displayed by the active matrix display panel. In some implementations, the individual brightness voltage may be adjusted via pulse-width modulation and/or by adjusting a duty cycle at which the selected data electrode is driven.

At 306, the method 300 may include, while the first enable electrode is being driven with the display voltage, driving a second enable electrode different than the first enable electrode with a transmit voltage that does not activate the display cells connected to the second enable electrode and produces a capacitive coupling between the second enable electrode and one or more receive electrodes coupled to the active matrix display panel. In particular, the transmit voltage may be configured to place a transistor of each display cell connected to the second enable electrode in a depletion state that does not activate the display cell.

In some implementations, the display voltage may be biased in a first polarity and the transmit voltage may be biased in a second polarity that opposes the first polarity. For example, the display voltage may be a positive voltage and the transmit voltage may be a negative voltage. In some implementations, the transmit voltage may be driven at a frequency that differs from a frequency at which the display voltage is driven. For example, enable electrodes that are driven with the transmit voltage may be toggled a plurality of times (e.g., 3-4×) during a period where a selected enable electrode is driven with the display voltage. The difference in polarities and frequencies may make changes in capacitance more clearly identifiable from capacitance effects resulting from image display operations.

It will be appreciated that the voltage levels, polarities, etc. discussed herein will depend on transistor types and configuration. For example, voltage levels and polarities may vary when one or more transistors are switch from p-type to n-type or vice versa. Thin film transistor characteristics may change based on the semiconductor material used. For example, TFT's based on Indium Gallium Zinc Oxide (IGZO) may have different properties than TFT's based on hydrogenated amorphous silicon or low temperature polysilicon. TFT threshold voltages may depend on the gate insulator type and thickness. For example, the higher the gate insulator thickness, the higher the threshold voltage and the higher the gate dielectric breakdown voltage. If the transmit voltage is close to the display enable voltage due to TFT limitations, then more sophisticated signal processing techniques may be applied to measure touch-induced charge change on the receive electrodes from charge induced by display enable electrodes. In one example, the transmit waveform may be made quite different than the display enable waveform, and a signal correlation and baseline subtraction may be used to extract the touch-related signal. Driving multiple transmit signals simultaneously may proportionately increase the capacitive coupling to receive lines relative to a single enable line that would be used to drive a signal display row. Further, a touch-related signal may increase with a transmit signal, while noise that is coupled into the receive lines from the display remains constant. As such, the transmit voltage may be increased relative to the display voltage.

In some implementations, a subset of two or more enable electrodes that does not include the first enable electrode (the one providing the display functionality) may be driven with the transmit voltage to produce a capacitive coupling between that subset and the one or more receive electrodes. In one example, the subset may include a plurality of neighboring enable electrodes. "Neighboring," as used herein, does not require adjacency, but instead refers to a locally clustered grouping. Specifically, a neighbored grouping potentially might include skipping enable electrodes (e.g., a grouping that skipped every other enable electrode). In another example, the subset may include a plurality of enable electrodes that neighbor the first enable electrode. In another example, the subset may include enable electrodes that are spaced apart, and overlapped by a common receive electrode, or positioned proximate to a common receive electrode. In another example, different enable electrodes may be overlapped by receive electrodes to varying degrees, and enable electrodes that are overlapped by receive electrodes to lesser degrees are included in the subset in favor of enable electrodes that are overlapped by receive electrodes to greater degrees. In configurations with varying degrees of overlap, a drive scheme may include using only lesser-overlapped enable electrodes for the touch functionality.

In some implementations, at 308, the method 300 optionally may include, holding enable electrodes that are not being driven with the display voltage or the transmit voltage at a relative ground.

At 310, the method 300 may include determining if a change in capacitance between the second enable electrode and one or more of the receive electrodes is greater than a threshold difference. For example, a current measured at a receive electrode that differs from a baseline current by more than a threshold difference may indicate a presence of touch input at a particular horizontal location on the display. In one example, touch input by a finger may reduce an amount of current induced in the one or more receive electrode because the finger draws away some of the charge from the one or more receive electrodes. In other words, the change in capacitance may produce a change in current in the one or more receive electrodes that is greater than a threshold difference from the baseline current. If a change in capacitance is greater than the threshold, then the method 300 moves to 312. Otherwise, the method 300 moves to 314.

At 312, the method 300 may include recognizing a touch input to the touch display device based on the change in capacitance between the second enable electrode and the one or more receive electrodes.

At 314, the method 300 may include determining if all enable electrodes of the active matrix display panel have been driven with a display voltage. If all enable electrodes have been driven with the display voltage, then a display scanning sequence of the active matrix display panel is complete, and the method 300 may return to other operations, or restart the display scanning sequence. Otherwise, the method 300 moves to 316.

At 316, the method 300 may include iterating to a next enable electrode of the active matrix display panel, and the method 300 returns to 302. The method 300 may iterate through the enable electrodes until a scanning sequence of the active matrix display panel is complete.

By utilizing enable electrodes already present in the active matrix display panel as transmitting electrodes of a touch sensor, a discrete transmit electrode layer may be eliminated from the touch display device. Moreover, a corresponding adhesive layer that would attach the discrete transmit electrode layer to the active matrix display panel may be eliminated from the touch sensing display device. Accordingly, a touch display device configured in such a manner may have reduced production costs and reduced device thickness relative to a touch display device having discrete display enable electrodes and touch transmit electrodes.

Figure 4:
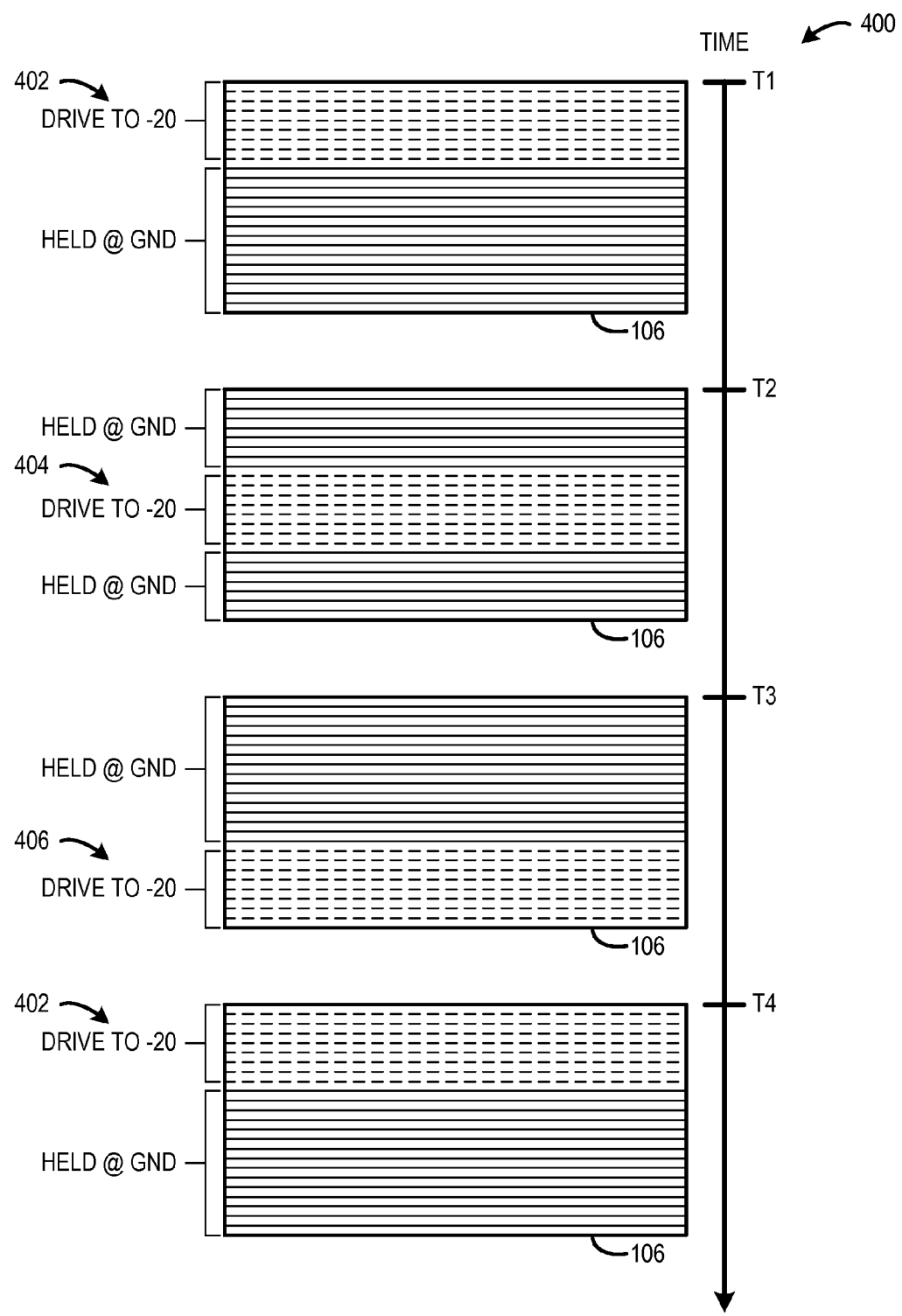
FIG. 4 shows an example approach for driving enable electrodes of the display panel of FIG. 2 to provide touch sensing functionality.

The enable electrodes may be excited for display and for the capacitive touch sensing measurements in any order, subject only to the constraint that a given enable electrode cannot be simultaneously driven with both the display voltage and the transmit voltage. FIG. 4 shows an example scanning sequence 400 for driving enable electrodes of the active matrix display panel 106 to provide touch sensing functionality. In particular, different subsets of neighboring enable electrodes may be driven with the transmit voltage in different time slots of the scanning sequence 400.

In the illustrated example, enable electrodes being driven with the transmit voltage are depicted with dashed lines, and enable electrodes being held at a relative ground are depicted with solid lines. For purposes of simplicity, an enable electrode that is being driven with the display voltage is omitted from the illustrated example. However, any suitable enable electrode may be driven with the display voltage relative to the enable electrodes being driven with the transmit voltage and the enable electrodes being held at relative ground.

At time T1, a first subset 402 of neighboring enable electrodes located in an upper region of the active matrix display panel 106 are driven with the transmit voltage to create a capacitive coupling to measure for touch input to the upper region of the active matrix display panel 106. Further, enable electrodes that are not included in the first subset 402 and are not being driven with the display voltage may be held at relative ground. The first subset 402 of neighboring enable electrodes may be driven with the transmit voltage during a first time slot of the scanning sequence.

At time T2, a second subset 404 of neighboring enable electrodes located in a middle region of the active matrix display panel 106 are driven with the transmit voltage to create a capacitive coupling to measure for touch input to the middle region of the active matrix display panel 106. Further, enable electrodes that are not included in the second subset 404 and are not being driven with the display voltage may be held at relative ground. The second subset 404 of neighboring enable electrodes may be driven with the transmit voltage during a second time slot of the scanning sequence.

At time T3, a third subset 406 of neighboring enable electrodes located in a lower region of the active matrix display panel 106 are driven with the transmit voltage to create a capacitive coupling to measure for touch input to the lower region of the active matrix display panel 106. Further, enable electrodes that are not included in the third subset 406 and are not being driven with the display voltage may be held at relative ground. The third subset 406 of neighboring enable electrodes may be driven with the transmit voltage during a third time slot of the scanning sequence.

At time T4, the entire surface of the active matrix display panel 106 has been scanned for touch input, so the scanning sequence 400 is complete. Accordingly, the scanning sequence 400 may be repeated, and the first subset 402 of neighboring enable electrodes may be driven with the transmit voltage in accordance with the first time slot. The scanning sequence 400 is merely one non-limiting example. Any suitable number of subsets of enable electrodes may be employed in a scanning sequence. Moreover, subsets of enable electrodes may be driven in any suitable order across the active matrix. The scanning sequence 400 may be particularly useful in large-format display devices that operate with relatively fast refresh rates (e.g., 60 Hz or 120 Hz), because touch sensing measurements and analysis may be unable to be completed for all enable electrodes of the active matrix display panel 106 within a time period defined by the refresh rate. Instead, the enable electrodes may be grouped into subsets, and measurements and analysis may be performed on different subset(s) during cycles or time slots in accordance with the refresh rate.

In another example approach, a scanning sequence may interleave an enable electrode driven with the display voltage (e.g., +5 volts), an enable electrode driven with the transmit voltage (e.g. −20 volts), and enable electrodes held at relative ground. For example, five enable electrodes may be excited as follows:

|  | Enable Electrode 0 | Enable Electrode 1 | Enable Electrode 2 | Enable Electrode 3 | Enable Electrode 4 |
|---|---|---|---|---|---|
| time | 5 | 0 | 0 | 0 | 0 |
|  | −20 | 5 | −20 | −20 | −20 |
|  | 0 | 0 | 5 | 0 | 0 |
|  | −20 | −20 | −20 | 5 | −20 |
|  | 0 | 0 | 0 | 0 | 5 |
|  | −20 | −20 | −20 | −20 | −20 |

Such a scanning sequence may be useful to avoid scenarios where non-local capacitive currents are injected into capacitance measurements to reduce touch sensing accuracy (e.g., when a touch at a particular location affects the apparent capacitance at a different location). It may be desirable to make the charge induced on the receive electrodes predictable and regular due to the enable electrodes being driven to a display voltage. In such a case, the receive signal due to the displaying an image can be largely cancelled out in a signal processing circuit, and the touch signal to noise ratio can be kept high. Otherwise, the display drive voltage may be treated as random noise that cannot be easily reduced, and touch signal-to-noise ratio may be much lower.

Further, it may be desirable that as each touch transmit set of electrode is scanned, the signal from displaying an image remains in fairly constant proportion to the signal due to touch. If the touch scanning and display scanning are not correlated in location, the proportionality may be broken. For example, the signal coupled from the top transmit electrode rows into the receive electrodes is not identical to the signal coupled from the bottom transmit rows, due to finite conductivity of the receive electrodes. Such scenarios may arise in configurations having particular receive electrode geometries. Enable electrodes driven with the transmit voltage may be spaced apart by any suitable number of enable electrodes that are held at ground in such an interleaved approach. As such, non-touch-related charge signals on the receive electrodes may be applied regularly and predictably.

Furthermore, different geometries of receive electrodes may be employed in the receive electrodes layer 116 overlaid on the active matrix display panel 106 that may influence the drive scheme performed by the enable driver 122. For example, different subsets of enable electrodes may be selected to be driven with the transmit voltage based on the geometry of the receive electrodes in the receive electrodes layer 116.

Figure 5:
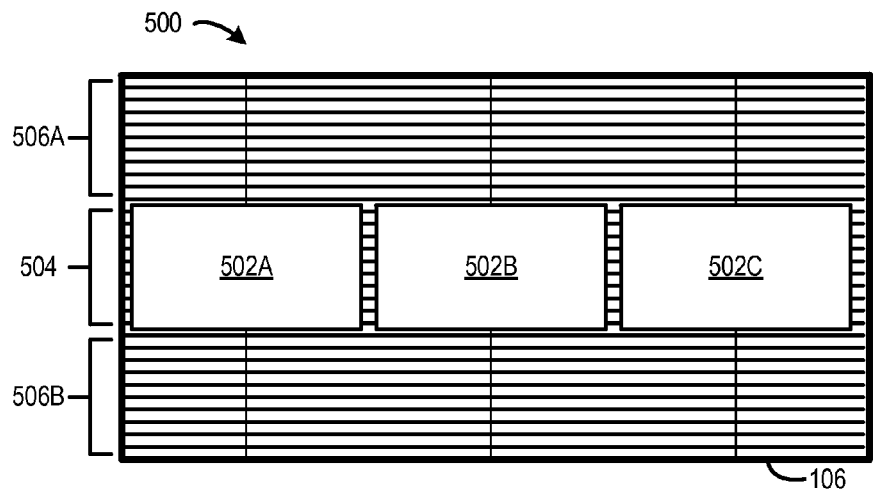
FIG. 5 shows an example geometry of a plurality of receive electrodes that may be coupled to the display panel of FIG. 2.

FIG. 5 shows an example geometry 500 of a plurality of rectangular receive electrodes 502 (e.g., 502A, 502B, 502C) that may be coupled to the active matrix display panel 106. Note that the illustrated example shows only a representative portion of the receive electrodes layer 116 and the active matrix display panel 106. In this implementation, a subset of enable electrodes 504 that are overlapped by the plurality of receive electrodes 502 may not be driven with the transmit voltage. In particular, a capacitive coupling between the subset of enable electrodes 504 and the plurality of receive electrodes 502 would create an electric field in a location within the touch display device 100 where touch input would not be able to significantly interrupt the electric field to change the capacitance. In other words, the plurality of receive electrodes 502 and the subset of enable electrodes 504 may act as a parallel plate capacitor that blocks touch input from affecting the electric field. As such, touch input sensing accuracy may be reduced in such an approach. The more overlapped the transmit and receive electrodes are, the less fringe electric field is created and thus the less change a finger can make to the receive signal when it comes in proximity to the electrodes. The baseline signal can be subtracted from the total receive signal, but still the change from baseline upon a touch event is less. Given that the random noise on the receive electrodes is relatively constant and independent of the transmit electrode configuration, the signal-to-noise ratio for touch detection decreases.

Accordingly, in implementations that employ the receive electrode geometry 500, in order to avoid scenarios where touch input sensing accuracy may be reduced, subsets (e.g., subsets 506A, 506B) of enable electrodes that are not substantially overlapped by the plurality of receive electrodes 502 may be selected to be driven with the transmit voltage for capacitance measurements. Correspondingly, the subset of enable electrodes 504 may be skipped in a scanning sequence, such as the sequence described in FIG. 4. In other words, enable electrodes that are overlapped relatively less by the receive electrodes are used for touch functionality, and enables electrodes that are overlapped relatively more are not.

Figure 6:
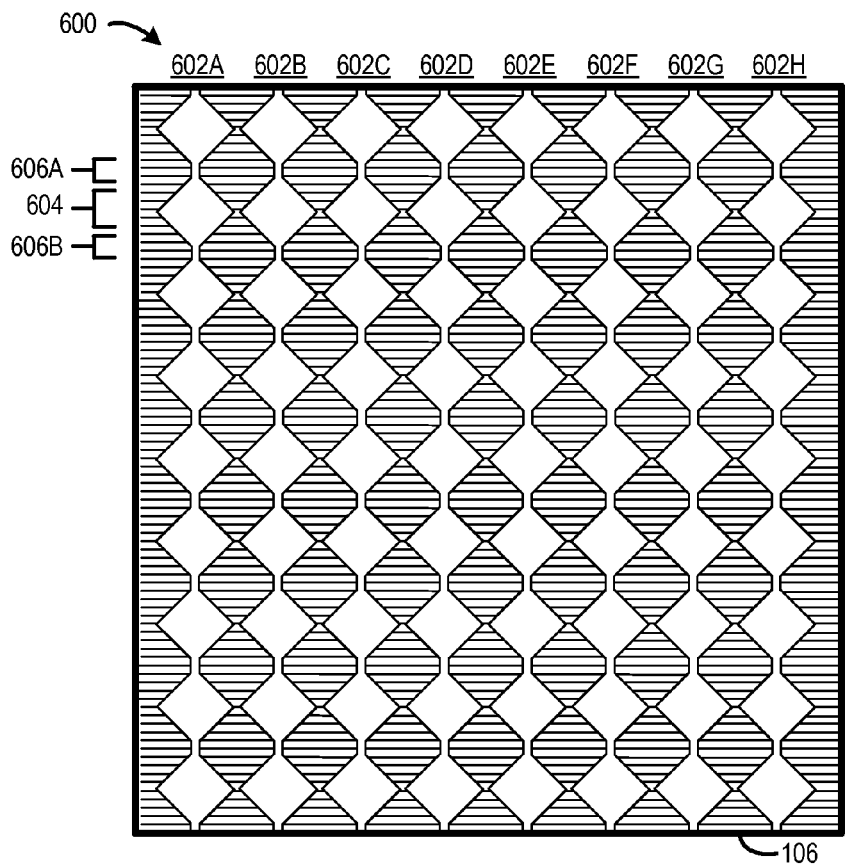
FIG. 6 shows another example geometry of a plurality of receive electrodes that may be coupled to the touch display panel of FIG. 2.

FIG. 6 shows another example geometry 600 of a plurality of diamond-shaped receive electrodes 602 (e.g., 602A-602H) that may be coupled to the active matrix display panel 106. Note that the illustrated example shows only a representative portion of the receive electrodes layer 116 and the active matrix display panel 106. In this implementation, the plurality of receive electrodes 602 overlap different enable electrodes to different degrees. For example, the plurality of receive electrodes 602 overlap a subset 604 of enable electrodes to a greater degree relative to the subset 606A of enable electrodes and the subset 606B of enable electrodes. The subset 606A of enable electrodes and the subset 606B of enable electrodes may be overlapped by the plurality of receive electrodes 602 to the same degree.

In implementations that employ the receive electrode geometry 600, subsets (e.g., subsets 606A and 606B) of enable electrodes that are overlapped by the plurality of receive electrodes 602 to a lesser degree may be selected to be driven with the transmit voltage over subsets (e.g., subset 604) of electrodes that are overlapped by the plurality of receive electrodes 602 to a greater degree. In some implementations, subsets of enable electrodes that are overlapped by the plurality of receive electrodes 602 (e.g., subset 604) may be skipped in a scanning sequence, such as the sequence described in FIG. 4.

In some implementations, a receive electrode geometry may include some enable electrodes that overlap some receive electrodes, and do not overlap other receive electrodes. For example, in such an implementation, measurements and analysis may be considered for touch input sensing only on pairs of enable electrodes and receive electrodes that do not overlap or overlap to a lesser degree.

Any suitable enable electrode scanning sequence may be employed based on any suitable receive electrode geometry. In some implementations, a combination of the concepts and examples described herein may be combined in a touch display device.

In some implementations, the methods and processes described herein may be tied to a computing system of one or more computing devices. In particular, such methods and processes may be implemented as a computer-application program or service, an application-programming interface (API), a library, and/or other computer-program product.

Figure 7:
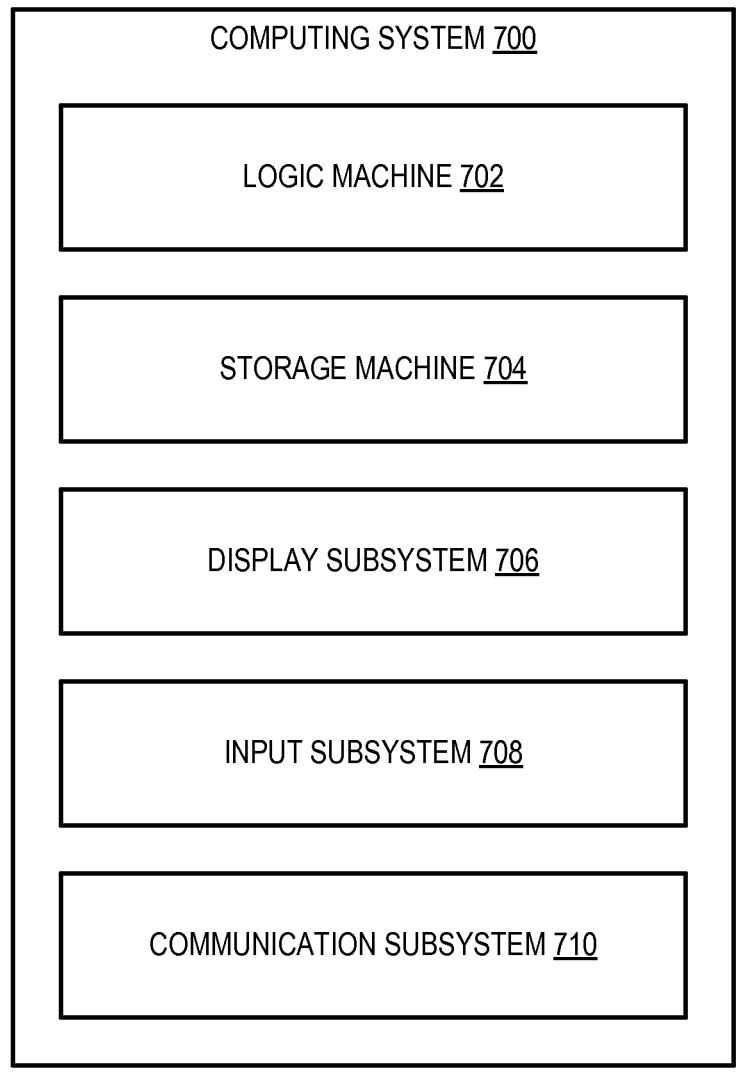
FIG. 7 shows an example computing device.

FIG. 7 schematically shows a non-limiting implementation of a computing system 700 that can enact one or more of the methods and processes described above. Computing system 700 is shown in simplified form. Computing system 700 may take the form of one or more personal computers, server computers, tablet computers, home-entertainment computers, network computing devices, gaming devices, mobile computing devices, mobile communication devices (e.g., smart phone), touch display computing devices and/or other computing devices. For example, computing system 700 may be representative of the touch display device 100 shown in FIG. 1.

Computing system 700 includes a logic machine 702 and a storage machine 704. Computing system 700 may optionally include a display subsystem 706, input subsystem 708, communication subsystem 710, and/or other components not shown in FIG. 7.

Logic machine 702 includes one or more physical devices configured to execute instructions. For example, the logic machine 702 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine 702 may include one or more processors configured to execute software instructions. Additionally or alternatively, the logic machine 702 may include one or more hardware or firmware logic machines configured to execute hardware or firmware instructions. Processors of the logic machine 702 may be single-core or multi-core, and the instructions executed thereon may be configured for sequential, parallel, and/or distributed processing. Individual components of the logic machine 702 optionally may be distributed among two or more separate devices, which may be remotely located and/or configured for coordinated processing. Aspects of the logic machine 702 may be virtualized and executed by remotely accessible, networked computing devices configured in a cloud-computing configuration.

Storage machine 704 includes one or more physical devices configured to hold instructions executable by the logic machine 702 to implement the methods and processes described herein. When such methods and processes are implemented, the state of storage machine 704 may be transformed—e.g., to hold different data.

Storage machine 704 may include removable and/or built-in devices. Storage machine 74 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 704 may include volatile, nonvolatile, dynamic, static, read/write, read-only, random-access, sequential-access, location-addressable, file-addressable, and/or content-addressable devices.

It will be appreciated that storage machine 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 702 and storage machine 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example. In one example, the logic subsystem 104 of the touch input display device 100 shown in FIG. 1 may include at least some of the components described above with respect to the logic machine 702 and/or the storage machine 704.

When included, display subsystem 706 may be used to present a visual representation of data held by storage machine 704. This visual representation may take the form of a graphical user interface (GUI). As the herein described methods and processes change the data held by the storage machine, and thus transform the state of the storage machine, the state of display subsystem 706 may likewise be transformed to visually represent changes in the underlying data. Display subsystem 706 may include one or more display devices utilizing virtually any type of technology. Such display devices may be combined with logic machine 702 and/or storage machine 704 in a shared enclosure, or such display devices may be peripheral display devices.

When included, input subsystem 708 may comprise or interface with one or more user-input devices such as a keyboard, mouse, touch screen, or game controller. In some implementations, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some implementations, the communication subsystem may allow computing system 700 to send and/or receive messages to and/or from other devices via a network such as the Internet.

In another example implementation, a device comprises a display panel, a plurality of receive electrodes coupled to the display panel, an enable electrode driver, and a touch sense circuit. The display panel includes (1) a plurality of display cells each including a display element, (2) a plurality of data electrodes connected to the plurality of display cells, and (3) a plurality of enable electrodes connected to the plurality of display cells, where each display cell is connected to a different pair of an enable electrode of the plurality of enable electrodes and a data electrode of the plurality of data electrodes. The enable electrode driver is configured to (1) drive a first enable electrode with a display voltage to activate display cells coupled to the first enable electrode, and (2) drive a second enable electrode different than the first enable electrode with a transmit voltage that does not activate the display cells coupled to the second enable electrode and produces a capacitive coupling between the second enable electrode and one or more of the plurality of receive electrodes. The touch sense circuit is configured to recognize a touch input to the touch display device based on a change in capacitance between the second enable electrode and one or more of the plurality of receive electrodes. In one example implementation that optionally may be combined with any of the features described herein, the second enable electrode is driven with the transmit voltage while the first enable electrode is being driven with the display voltage. In one example implementation that optionally may be combined with any of the features described herein, the display voltage is biased in a first polarity and the transmit voltage is biased in a second polarity that opposes the first polarity. In one example implementation that optionally may be combined with any of the features described herein, the enable electrode driver is configured to, while the first enable electrode is being driven with the display voltage, drive a subset of two or more enable electrodes of the plurality of enable electrodes with the transmit voltage to produce a capacitive coupling between the subset of two or more enable electrodes and the one or more of the plurality of receive electrodes. The touch sense circuit is configured to recognize a touch input to the touch display device based on a change in capacitance between the subset of two or more enable electrodes and the one or more of the plurality of receive electrodes. In one example implementation that optionally may be combined with any of the features described herein, the subset of two or more enable electrodes is a first subset. The enable electrode driver is configured to, while the first subset of two or more enable electrodes is being driven with the transmit voltage and while the first enable electrode is being driven with the display voltage, hold a second subset of enable electrodes that does not include the first enable electrode at a relative ground. In one example implementation that optionally may be combined with any of the features described herein, the plurality of enable electrodes include enable electrodes that are overlapped by the plurality of receive electrodes to a first degree and enable electrodes that are overlapped by the plurality of receive electrodes to less than the first degree. One or more of the enable electrodes that are overlapped by the plurality of receive electrodes to less than the first degree are included in the subset and the enable electrodes that are overlapped by the plurality of receive electrodes to the first degree are not included in the subset. In one example implementation that optionally may be combined with any of the features described herein, the two or more enable electrodes of the subset neighbor each other and/or neighbor the first enable electrode. In one example implementation that optionally may be combined with any of the features described herein, the display elements in each of the plurality of display cells are organic light emitting diodes (OLEDs). In one example implementation that optionally may be combined with any of the features described herein, the device further comprises a data driver configured, to while the first enable electrode is being driven with the display voltage, drive each of the plurality of data electrodes with an individual brightness voltage to adjust an individual brightness level of the display element of the display cell connected to the first enable electrode and the corresponding data electrode. In one example implementation that optionally may be combined with any of the features described herein, the transmit voltage is at least four times an unsigned magnitude of the display voltage.

In another example implementation, a method for controlling a touch display device including a display panel including (1) a plurality of display cells each including a display element, (2) a plurality of data electrodes connected to the plurality of display cells, and (3) a plurality of enable electrodes connected to the plurality of display cells, where each display cell is connected to a different pair of an enable electrode and a data electrode, and a plurality of receive electrodes coupled to the display panel, the method comprises driving a first enable electrode with a display voltage biased in a first polarity to activate display cells coupled to the first enable electrode, while the first enable electrode is being driven with the display voltage, driving a second enable electrode different than the first enable electrode with a transmit voltage biased in a second polarity opposing the first polarity to produce a capacitive coupling between the second enable electrode and one or more of the plurality of receive electrodes, and recognizing a touch input to the touch display device based on a change in capacitance between the second enable electrode and the one or more of the plurality of receive electrodes. In one example implementation that optionally may be combined with any of the features described herein, the method further comprises while the first enable electrode is being driven with the display voltage, driving a subset of two or more enable electrodes of the plurality of enable electrodes with the transmit voltage to produce a capacitive coupling between the subset of two or more enable electrodes and the one or more of the plurality of receive electrodes, and recognizing a touch input to the touch display device based on a change in capacitance between the subset of two or more enable electrodes and the one or more of the plurality of receive electrodes. In one example implementation that optionally may be combined with any of the features described herein, the subset of two or more enable electrodes is a first subset, and the method further comprises, while the first subset of two or more enable electrodes is being driven with the transmit voltage and while the first enable electrode is being driven with the display voltage, holding a second subset of enable electrodes that does not include the first enable electrode at a relative ground. In one example implementation that optionally may be combined with any of the features described herein, the plurality of enable electrodes include enable electrodes that are overlapped by the plurality of receive electrodes to a first degree and enable electrodes that are overlapped by the plurality of receive electrodes to less than the first degree. One or more of the enable electrodes that are overlapped by the plurality of receive electrodes to less than the first degree are included in the subset and the enable electrodes that are overlapped by the plurality of receive electrodes to the first degree are not included in the subset. In one example implementation that optionally may be combined with any of the features described herein, the method further comprises while the first enable electrode is being driven with the display voltage, driving each of the plurality of data electrodes with an individual brightness voltage to adjust an individual brightness level of the display element of the display cell connected to the first enable electrode and the corresponding data electrode. In one example implementation that optionally may be combined with any of the features described herein, the display element in each of the plurality of display cells is an organic light emitting diode (OLED). In one example implementation that optionally may be combined with any of the features described herein, the capacitive coupling produces a baseline current induced by the one or more receive electrodes and the change in capacitive coupling includes a change in currant induced by the one or more receive electrodes that is greater than a current threshold from the baseline current. In one example implementation that optionally may be combined with any of the features described herein, the transmit voltage is at least four times an unsigned magnitude of the display voltage.

In another example implementation, a touch display device comprises an organic light emitting diode (OLED) display panel, a plurality of receive electrodes coupled to the OLED display panel, an enable driver, a display driver, and a touch sense circuit. The OLED display panel includes (1) a plurality of display cells each including an OLED, (2) a plurality of data electrodes connected to the plurality of display cells, and (3) a plurality of enable electrodes connected to the plurality of display cells, where each display cell is connected to a different pair of an enable electrode of the plurality of enable electrodes and a data electrode of the plurality of data electrodes. The enable driver is configured to (1) drive a first enable electrode with a display voltage biased in a first polarity to activate display cells coupled to the first enable electrode, and (2) while the first enable electrode is being driven with the display voltage, drive a subset of two or more enable electrodes of the plurality of enable electrodes with a transmit voltage biased in a second polarity opposing the first polarity to produce a capacitive coupling between the subset of two or more enable electrodes and one or more of the plurality of receive electrodes.

The display driver is configured to, while the first enable electrode is being driven with the display voltage, drive each of the plurality of data electrodes with an individual brightness voltage to adjust an individual brightness level of the OLED of the display cell connected to the first enable electrode and the corresponding data electrode. The touch sense circuit is configured to recognize a touch input to the touch display device based on a change in capacitance between the subset of two or more enable electrodes and the one or more of the plurality of receive electrodes. In one example implementation that optionally may be combined with any of the features described herein, the plurality of enable electrodes include enable electrodes that are overlapped by the plurality of receive electrodes to a first degree and enable electrodes that are overlapped by the plurality of receive electrodes to less than the first degree. One or more of the enable electrodes that are overlapped by receive electrodes to less than the first degree are included in the subset and the enable electrodes that are overlapped by the plurality of receive electrodes to the first degree are not included in the subset.

It will be understood that the configurations and/or approaches described herein are exemplary in nature, and that these specific implementations or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A device comprising:
   a display panel including a plurality of display cells each including a display element, a plurality of data electrodes connected to the plurality of display cells, and a plurality of enable electrodes connected to the plurality of display cells, where each display cell of the plurality of display cells is connected to a different pair of an enable electrode of the plurality of enable electrodes and a data electrode of the plurality of data electrodes;
   a plurality of receive electrodes coupled to the display panel;
   an enable electrode driver configured to drive a first enable electrode of the plurality of enable electrodes with a display voltage biased in a first polarity to activate display cells of the plurality of display cells coupled to the first enable electrode, and drive a second enable electrode of the plurality of enable electrodes that is different than the first enable electrode with a transmit voltage biased in a second polarity opposing the first polarity and that does not activate the display cells of the plurality of display cells coupled to the second enable electrode and produces a capacitive coupling between the second enable electrode and one or more receive electrodes of the plurality of receive electrodes; and
   a touch sense circuit configured to recognize a touch input to the device based on a change in capacitance between the second enable electrode and the one or more receive electrodes.

2. The device of claim 1, where the second enable electrode is being driven with the transmit voltage while the first enable electrode is being driven with the display voltage.

3. The device of claim 1, where the enable electrode driver is configured to, while the first enable electrode is being driven with the display voltage, drive a subset of two or more enable electrodes of the plurality of enable electrodes with the transmit voltage to produce a capacitive coupling between the subset of two or more enable electrodes and the one or more of the plurality of receive electrodes; and
   where the touch sense circuit is configured to recognize a touch input to the touch display device based on a change in capacitance between the subset of two or more enable electrodes and the one or more of the plurality of receive electrodes.

4. The device of claim 3, where the subset of two or more enable electrodes is a first subset, and where the enable electrode driver is configured to, while the first subset of two or more enable electrodes is being driven with the transmit voltage and while the first enable electrode is being driven with the display voltage, hold a second subset of enable electrodes that does not include the first enable electrode at a relative ground.

5. The device of claim 3, where the plurality of enable electrodes include enable electrodes that are overlapped by the plurality of receive electrodes to a first degree and enable electrodes that are overlapped by the plurality of receive electrodes to less than the first degree, and where one or more of the enable electrodes that are overlapped by the plurality of receive electrodes to less than the first degree are included in the subset and the enable electrodes that are overlapped by the plurality of receive electrodes to the first degree are not included in the subset.

6. The device of claim 3, where the two or more enable electrodes of the subset neighbor each other or neighbor the first enable electrode.

7. The device of claim 1, where the display elements in each of the plurality of display cells are organic light emitting diodes (OLEDs).

8. The device of claim 1, further comprising:
   a data driver configured to, while the first enable electrode is being driven with the display voltage, drive each of the plurality of data electrodes with an individual brightness voltage to adjust an individual brightness level of the display element of the display cell connected to the first enable electrode and the corresponding data electrode.

9. The device of claim 1, where the transmit voltage is at least four times an unsigned magnitude of the display voltage.

10. A method for controlling a touch display device including a display panel including a plurality of display cells each including a display element, a plurality of data electrodes connected to the plurality of display cells, and a plurality of enable electrodes connected to the plurality of display cells, where each display cell of the plurality of display cells is connected to a different pair of an enable electrode of the plurality of enable electrodes and a data electrode of the plurality of data electrodes, and a plurality of receive electrodes coupled to the display panel, the method comprising:
   driving a first enable electrode of the plurality of enable electrodes with a display voltage biased in a first polarity to activate display cells of the plurality of display cells coupled to the first enable electrode;

while the first enable electrode is being driven with the display voltage, driving a second enable electrode of the plurality of enable electrodes and different than the first enable electrode with a transmit voltage biased in a second polarity opposing the first polarity to produce a capacitive coupling between the second enable electrode and one or more receive electrodes of the plurality of receive electrodes; and recognizing a touch input to the touch display device based on a change in capacitance between the second enable electrode and the one or more receive electrodes.

11. The method of claim 10, further comprising:
while the first enable electrode is being driven with the display voltage, driving a subset of two or more enable electrodes of the plurality of enable electrodes with the transmit voltage to produce a capacitive coupling between the subset of two or more enable electrodes and the one or more receive electrodes; and recognizing the touch input to the touch display device based on a change in capacitance between the subset of two or more enable electrodes and the one or more of receive electrodes.

12. The method of claim 11, where the subset of two or more enable electrodes is a first subset, and where the method further comprises, while the first subset of two or more enable electrodes is being driven with the transmit voltage and while the first enable electrode is being driven with the display voltage, holding a second subset of enable electrodes of the plurality of enable electrodes that does not include the first enable electrode at a relative ground.

13. The method of claim 11, where the plurality of enable electrodes include enable electrodes that are overlapped by the plurality of receive electrodes to a first degree and enable electrodes that are overlapped by the plurality of receive electrodes to less than the first degree, and where one or more of the enable electrodes that are overlapped by the plurality of receive electrodes to less than the first degree are included in the subset and the enable electrodes that are overlapped by the plurality of receive electrodes to the first degree are not included in the subset.

14. The method of claim 10, further comprising:
while the first enable electrode is being driven with the display voltage, driving each data electrode of the plurality of data electrodes with an individual brightness voltage to adjust an individual brightness level of the display element of the display cell connected to the first enable electrode and the corresponding data electrode.

15. The method of claim 10, where the display element in each display cell of the plurality of display cells is an organic light emitting diode (OLED).

16. The method of claim 10, where the capacitive coupling produces a baseline current induced by the one or more receive electrodes and the change in capacitive coupling includes a change in current induced by the one or more receive electrodes that is greater than a current threshold from the baseline current.

17. The method of claim 10, where the transmit voltage is at least four times an unsigned magnitude of the display voltage.

18. A touch display device comprising:
an organic light emitting diode (OLED) display panel including a plurality of display cells each including an OLED, a plurality of data electrodes connected to the plurality of display cells, and a plurality of enable electrodes connected to the plurality of display cells, where each display cell of the plurality of display cells is connected to a different pair of an enable electrode of the plurality of enable electrodes and a data electrode of the plurality of data electrodes;

a plurality of receive electrodes coupled to the OLED display panel;

an enable driver configured to drive a first enable electrode of the plurality of enable electrodes with a display voltage biased in a first polarity to activate display cells coupled to the first enable electrode, and while the first enable electrode is being driven with the display voltage, drive a subset of two or more enable electrodes of the plurality of enable electrodes with a transmit voltage biased in a second polarity opposing the first polarity to produce a capacitive coupling between the subset of two or more enable electrodes and one or more receive electrodes of the plurality of receive electrodes;

a display driver configured to, while the first enable electrode is being driven with the display voltage, drive each data electrode of the plurality of data electrodes with an individual brightness voltage to adjust an individual brightness level of the OLED of the display cell connected to the first enable electrode and the corresponding data electrode; and a touch sense circuit configured to recognize a touch input to the touch display device based on a change in capacitance between the subset of two or more enable electrodes and the one or more receive electrodes.

19. The touch display device of claim 18, where the plurality of enable electrodes include enable electrodes that are overlapped by the plurality of receive electrodes to a first degree and enable electrodes that are overlapped by the plurality of receive electrodes to less than the first degree, and where one or more of the enable electrodes that are overlapped by receive electrodes to less than the first degree are included in the subset and the enable electrodes that are overlapped by the plurality of receive electrodes to the first degree are not included in the subset.

* * * * *